United States Patent
Chang et al.

(10) Patent No.: US 11,908,853 B2
(45) Date of Patent: Feb. 20, 2024

(54) INTEGRATED CIRCUIT AND METHOD OF GENERATING INTEGRATED CIRCUIT LAYOUT

(71) Applicant: TAIWAN SEMICONDUCTOR MANUFACTURING CO., LTD., Hsinchu (TW)

(72) Inventors: Fong-Yuan Chang, Hsinchu County (TW); Kuo-Nan Yang, Hsinchu (TW); Chung-Hsing Wang, Hsinchu County (TW); Lee-Chung Lu, Taipei (TW); Sheng-Fong Chen, Hsinchu County (TW); Po-Hsiang Huang, Tainan (TW); Hiranmay Biswas, Kolkata (IN); Sheng-Hsiung Chen, Hsinchu County (TW); Aftab Alam Khan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/069,887

(22) Filed: Dec. 21, 2022

(65) Prior Publication Data
US 2023/0121153 A1 Apr. 20, 2023

Related U.S. Application Data

(63) Continuation of application No. 17/214,703, filed on Mar. 26, 2021, now Pat. No. 11,552,068, which is a continuation of application No. 16/724,001, filed on Dec. 20, 2019, now Pat. No. 10,964,685, which is a continuation of application No. 16/122,762, filed on Sep. 5, 2018, now Pat. No. 10,515,944.

(Continued)

(51) Int. Cl.
*H01L 27/02* (2006.01)
*H01L 23/522* (2006.01)
*H01L 27/118* (2006.01)
*G06F 30/394* (2020.01)

(52) U.S. Cl.
CPC ........ *H01L 27/0207* (2013.01); *G06F 30/394* (2020.01); *H01L 23/5226* (2013.01); *H01L 27/11807* (2013.01); *H01L 2027/11881* (2013.01)

(58) Field of Classification Search
None
See application file for complete search history.

(56) References Cited

U.S. PATENT DOCUMENTS 7,923,755 B2 4/2011 Mizushino et al.
2010/0001404 A1 1/2010 Ikegami et al.
(Continued)

*Primary Examiner* — Hsien Ming Lee
(74) *Attorney, Agent, or Firm* — Maschoff Brennan

(57) ABSTRACT

An integrated circuit includes a cell layer including a first cell and a second cell, a first metal layer over the cell layer and having a first conductive feature, a second metal layer over the first metal layer and having a second conductive feature, and a first via between the first metal layer and the second metal layer and connecting the first conductive feature to the second conductive feature. The first conductive feature spans over a boundary between the first and second cells, and has a lengthwise direction along a first direction. The second conductive feature spans over the boundary between the first and second cells, and has a lengthwise direction along a second direction that is perpendicular to the first direction.

20 Claims, 7 Drawing Sheets

Related U.S. Application Data

(60) Provisional application No. 62/585,917, filed on Nov. 14, 2017.

(56) References Cited

U.S. PATENT DOCUMENTS

| | | |
|---|---|---|
| 2011/0051509 A1 | 3/2011 | Rao et al. |
| 2017/0352623 A1 | 12/2017 | Chang et al. |
| 2018/0150589 A1 | 5/2018 | Yang et al. |

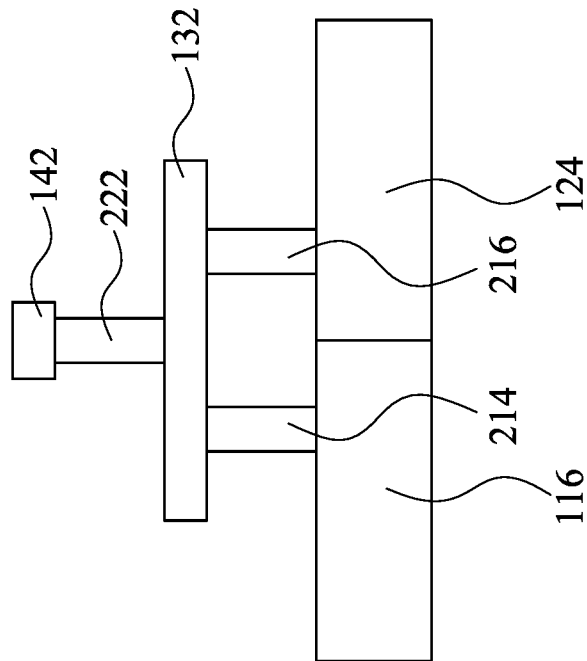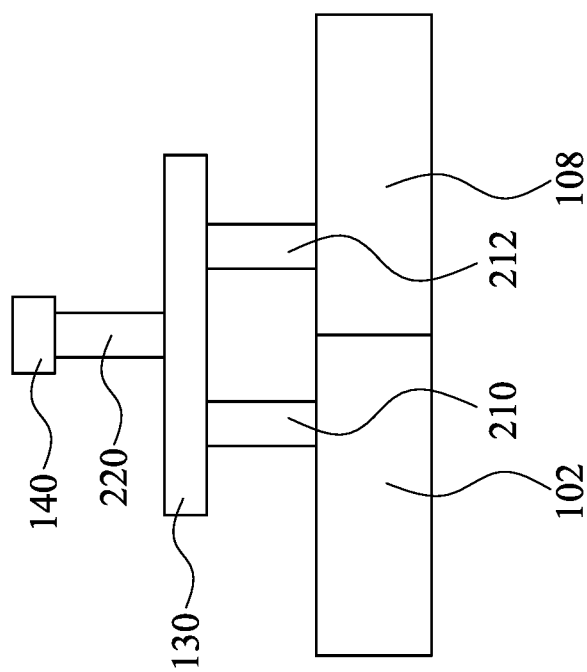
Fig. 2

INTEGRATED CIRCUIT AND METHOD OF GENERATING INTEGRATED CIRCUIT LAYOUT

RELATED APPLICATIONS

The present application is a Continuation application of U.S. application Ser. No. 17/214,703, filed on Mar. 26, 2021, which is a Continuation application of U.S. application Ser. No. 16/724,001, filed on Dec. 20, 2019, now U.S. Pat. No. 10,964,685, issued on Mar. 30, 2021, which is a Continuation application of U.S. application Ser. No. 16/122,762, filed on Sep. 5, 2018, now U.S. Pat. No. 10,515,944, issued on Dec. 24, 2019, which claims priority of U.S. Provisional Application Ser. No. 62/585,917, filed on Nov. 14, 2017, which is herein incorporated by reference in their entireties.

BACKGROUND

Computer-aided cell-based design has been developed for designing integrated circuits, e.g., large scale integrated circuits such as application specific integrated circuits (ASICs). A cell, such as a standard cell, is configured to perform a logic circuit function that has been pre-designed and pre-verified as a building block of an integrated circuit. In a standard cell design, each distinct cell in a library may have geometries of active, gate, and metal levels. Examples of standard cells include an inverter, a NAND gate, a NOR gate, a flip flop, and other logic gate circuits.

Integrated circuit design includes mainly of two steps: placement and routing. During the placement step, the positions and orientations of cells are determined. During the routing step, interconnects or conductive features are added to connect ports of the cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic cross-sectional view taken along line 2-2 of FIG. 1 in accordance with some embodiments of the present disclosure;

DETAILED DESCRIPTION

Figure 1:
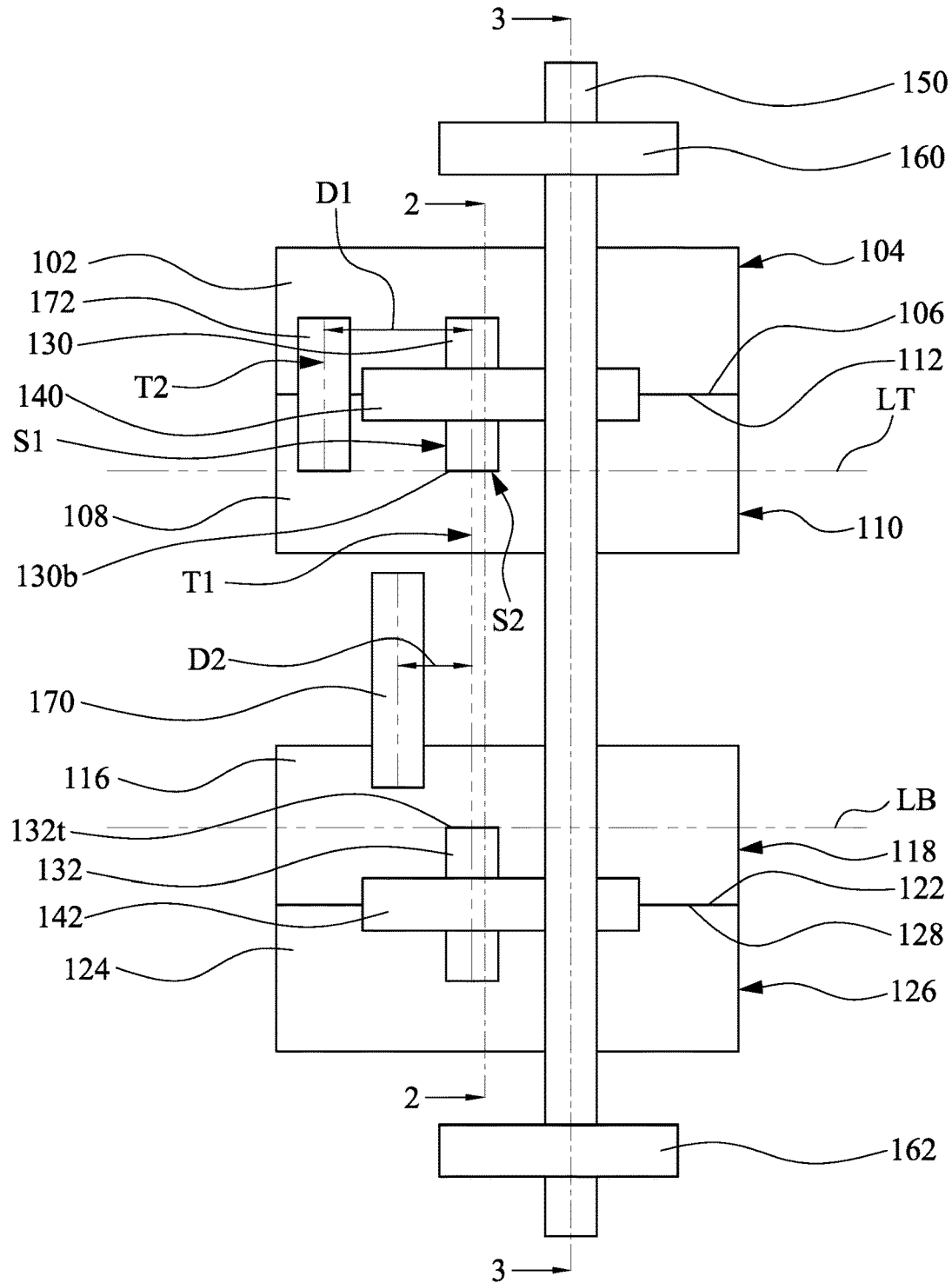
FIG. 1 is a schematic top view of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide integrated circuits and methods for generating integrated circuit layouts that can be used to fabricate the integrated circuits. In an exemplary embodiment, an integrated circuit, e.g., integrated circuit 100 of FIG. 1, comprises a cell layer and a metal layer. The metal layer, e.g., M1 layer, includes one or more metal lines, e.g., horizontal interconnects, and is closest to the cell layer. The metal line extends along a track, e.g., track (T1) of FIG. 1, and is configured to receive a supply voltage. The metal line is divided into at least a pair of first and second conductive features, e.g., conductive features 130, 132 of FIG. 1. As such, a third conductive feature, e.g., conductive feature 170 of FIG. 1, through which the integrated circuit 100 send a circuit signal, may be arranged very close to or even along the same track (T1) as the first and second conductive features 130, 132. This increases the number of access points of the integrated circuit 100, enhancing a routing density of the integrated circuit 100.

Reference is made to FIG. 1, which is a schematic top view of an integrated circuit 100 in accordance with some embodiments of the present disclosure. The integrated circuit 100 is configured to receive a supply voltage, e.g., a first supply voltage or a second supply voltage that has a higher level than the first supply voltage. The integrated circuit 100 is further configured to send a circuit signal, e.g., a data signal, a control signal, other circuit signal, or a combination thereof.

The integrated circuit 100 includes a cell layer and a plurality of metal layers, one above the other, above the cell layer. As illustrated in FIG. 1, the cell layer includes a plurality of cells 102, 108, 116, 124 and a plurality of conductive features 130, 132, 140, 142, 150, 160, 162, 170, 172. The cells 102, 108, 116, 124 may be in an active region of the cell layer and include a plurality of transistors. For example, each of the cells 102, 108, 116, 124 includes an inverter, an NAND gate, or other logic gate circuit configured to perform a logic circuit function. A layout of the integrated circuit 100 can be designed by tools, such as an electronic design automation (EDA) tool in accordance with a layout design rule.

Each of cells 102, 108, 116, and 124 includes a boundary 104, 110, 118, 126 in a rectangular shape, as illustrated in FIG. 1. Other suitable boundary shapes are contemplated herein, e.g., circular, triangular, hexagonal, or the like. The cells 102, 108 are adjacent to each other. For example, a bottom edge 106 of the boundary 104 of the cell 102 coincides with a top edge 112 of the boundary 110 of the cell 108. Also, the cells 116, 124 are adjacent to each other. For example, a bottom edge 122 of the boundary 118 of the cell 116 coincides with a top edge 128 of the boundary 126 of the cell 124. The cells 102, 108 are spaced from, i.e., not adjacent, the cells 116, 124. For example, none of the edges of the boundaries 104, 110 coincides with the edges of the boundaries 118, 126. Each of the cells 102, 108, 116, 124 has a cell height defined by a distance from top to bottom edges of the boundary 104, 110, 118, 126 thereof.

In this exemplary embodiment, the integrated circuit 100 does not include cells between the cells 108, 116, and in an alternative embodiment, the integrated circuit 100 includes one or more cells between the cells 108, 116.

The conductive features 130, 132, 140, 142, 150, 160, 162, 170, 172 are metal lines, e.g., horizontal interconnects. The integrated circuit 100 is configured to receive the supply voltage through the conductive features 130, 132, 140, 142, 150, 160, 162 and to send a circuit signal through the conductive features 170, 172. As illustrated in FIG. 1, the conductive feature 130 extends from the cell 102 into the cell 108, i.e., opposite ends of the conductive feature 130 are respectively inside the cells 102, 108, across the bottom and top edges 106 and 112 of the cells 102, 108. Similarly, the conductive feature 132 extends from the cell 116 into the cell 124 across the bottom and top edges 122 and 128 of the cells 116, 124. In some embodiments, the conductive features 130 and 132 have different lengths and, in other embodiments, the conductive features 130, 132 have the same length.

Although the integrated circuit 100 is exemplified as having only a single conductive feature 130/132, it should be understood that the number of the conductive features 130/132 may be increased as required.

In this exemplary embodiment, the conductive features 130, 132, 140, 142, 150, 160, 162, 170, 172 are rectangular-shaped conductive features. Other suitable conductive features are contemplated herein, e.g., L-shaped conductive features, U-shaped conductive features, or the like. For example, the conductive feature 130 has a length (S1) and a width (S2) and the length (S1) is in a range from about one to about ten times the width (S2). It is noted that the dimensions (S1, S2) of the conductive feature 130 and a distance between the conductive features 130 and 132 may be determined according to a layout design rule.

Further, the conductive features 130, 132 are collinear. In particular, as illustrated in FIG. 1, the integrated circuit 100 includes a plurality of tracks, e.g., tracks (T1, T2). The conductive features 130, 132 extend along the same track, e.g., track (T1).

With further reference to FIG. 2, which is a schematic cross-sectional view taken along line 2-2 of FIG. 1 in accordance with some embodiments of the present disclosure, the conductive features 130, 132 are in the same metal layer, e.g., M1 layer, above the cells 102, 108, 116, 124 of the cell layer. Similarly, the conductive features 140, 142 are in the same metal layer, e.g., M2 layer, above the conductive features 130, 132 and, as shown in FIG. 1, extend substantially perpendicular to the conductive feature 130/132.

The integrated circuit 100 further includes a plurality of conductive vias 210, 212, 214, 216, 220, 222. The conductive vias 210, 212, 214, 216, 220, 222 are vertical interconnects substantially perpendicular to the conductive features 130, 132, 140, 142. As illustrated in FIG. 2, the conductive via 210 interconnects the cell 102 and the conductive feature 130, electrically coupling the cell 102 and the conductive feature 130 to each other. For example, the conductive via 210 may interconnect a power rail of the cell 102 configured to receive the supply voltage and the conductive feature 130.

Similarly, the conductive via 212 interconnects the cell 108 and the first conductive feature 130. Each of the conductive vias 214, 216 interconnects the conductive feature 132 and a respective one of the cells 116, 124. Each of the conductive vias 220, 222 interconnects a respective one of the conductive features 130, 132 and a respective one of the conductive features 140, 142.

As illustrated in FIG. 1, the conductive feature 140 extends along the edge 106/112 and across the conductive feature 130. Similarly, the conductive feature 142 extends along the edge 122/128 and across the conductive feature 132. In some embodiments, the conductive features 140, 142 have different lengths. In other embodiments, the conductive features 140, 142 have the same length. In such other embodiments, opposite ends of the conductive feature 140 may be aligned with opposite ends of the conductive feature 142, respectively.

The conductive feature 150 is substantially parallel to the conductive feature 130/132 and extends across the conductive features 140 and 142 and the cells 102, 108, 116, 124. Further, the conductive feature 150 is in a metal layer, e.g., M3 layer, above the conductive features 140, 142.

The cells 102, 108, 116, 124 are between the conductive features 160, 162. The conductive features 160, 162 are substantially parallel to the conductive feature 140/142 and extend across the conductive feature 150. As illustrated in FIG. 1, the conductive feature 160 is outside the cell 102 and the conductive feature 162 is outside the cell 124. In an alternative embodiment, the conductive feature 160 is inside the cell 102 and the conductive feature 162 is outside the cell 124, the conductive feature 160 is outside the cell 102 and the conductive feature 162 is inside the cell 124, or the conductive features 160, 162 inside the cells 102, 124, respectively.

In some embodiments, the conductive features 160, 162 have different lengths. In other embodiments, the conductive features 160, 162 have the same length. In such other embodiments, the conductive feature 160 has opposite ends may be aligned with opposite ends of the conductive feature 162, respectively. Further, the conductive features 160, 162 are in a metal layer, e.g., M4 layer, above the conductive feature 150.

In certain embodiments, the integrated circuit 100 further includes a conductive feature that serves as a power rail configured to receive the supply voltage and to distribute the supply voltage to the cells of the integrated circuit 100, e.g., cells 102, 108, 116, 124, through conductive features thereunder, e.g., conductive features 130, 132, 140, 142, 150, 160, 162.

Figure 3:
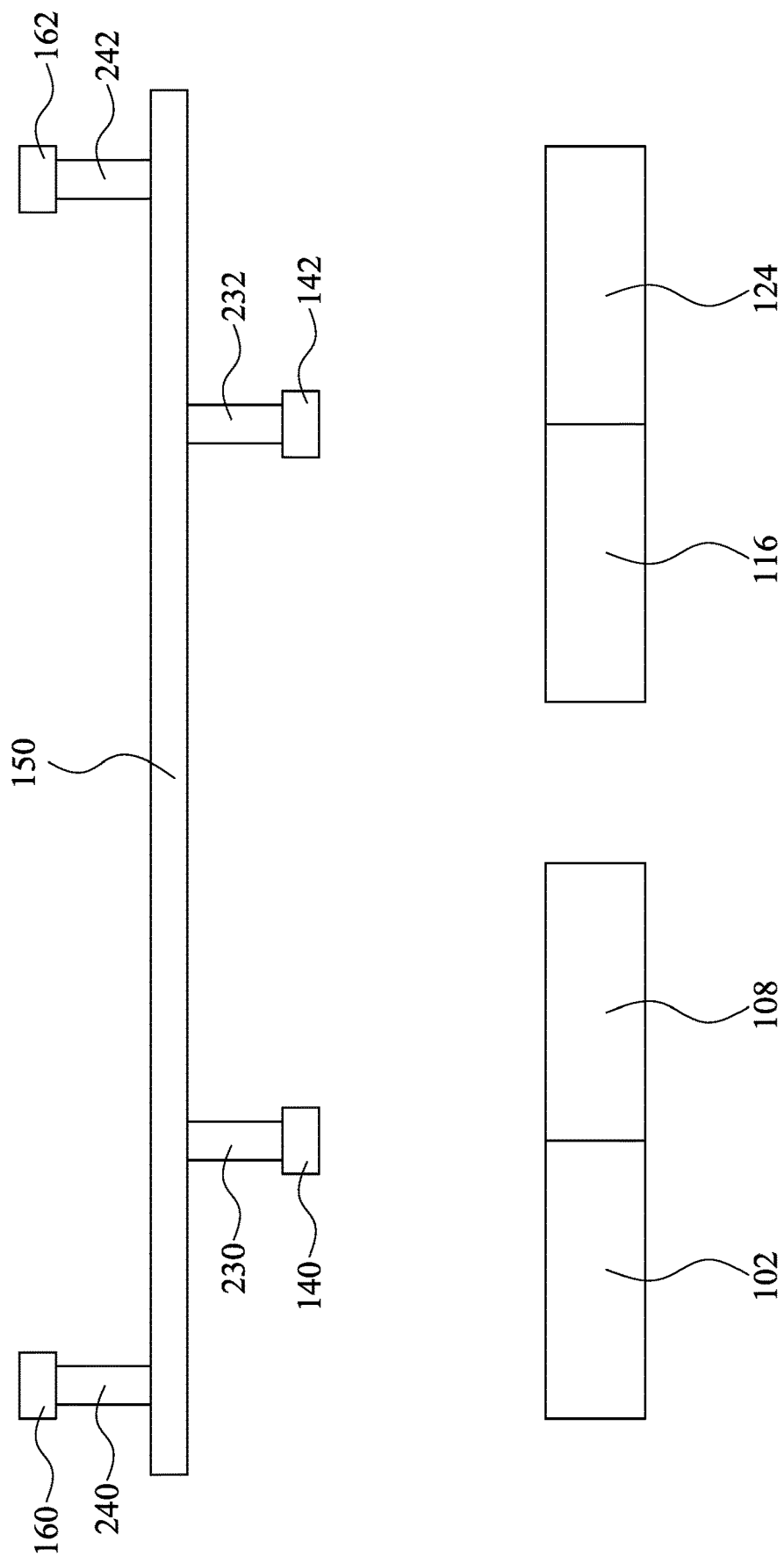
FIG. 3 is a schematic cross-sectional view taken along line 3-3 of FIG. 1 in accordance with some embodiments of the present disclosure.

With further reference to FIG. 3, which is a schematic cross-sectional view taken along line 3-3 of FIG. 1 in accordance with some embodiments of the present disclosure, the integrated circuit 100 further includes a plurality of conductive vias 230, 232, 240, 242. The conductive vias 230, 232, 240, 242 are vertical interconnects substantially perpendicular to the conductive features 140, 142, 150, 160, 162. As illustrated in FIG. 3, each of the conductive vias 230, 232 interconnects the conductive feature 150 and a respective one of the conductive features 140, 142. Similarly, each of the conductive vias 240, 242 interconnects the conductive feature 150 and a respective one of the conductive features 160, 162.

As illustrated in FIG. 1, in this exemplary embodiment, the conductive feature 170 is in the same metal layer, e.g., M1 layer, as the conductive features 130, 132. The conductive feature 170 is between the cells 108, 116 and extends substantially parallel to the conductive feature 130/132. The conductive feature 170 may interconnect components of cells of the integrated circuit 100 with each other. Further, the conductive feature 170 extends from outside the cell 116 into the cell 116. In some embodiments, the conductive feature 170 may extend from the cell 108 into the cell 116. In other embodiments, the conductive feature 170 is between and outside the cells 108, 116.

A bottom end 130b of the conductive feature 130 coincides with a line LT and a top end 132t of the conductive feature 132 coincides with a line LB. It is noted that, because the conductive feature 170 is between the lines LT and LB, the conductive feature 170 can be arranged very near or close the track (T1). In particular, the conductive feature 172 is in the same metal layer, e.g., M1 layer, as the conductive feature 170 and, as illustrated in FIG. 1, extends along a track (T2) such that a horizontal distance (D1) between the conductive features 130, 172 complies with the layout design rule. It is noted that the distance (D1) may be equal to a pitch of the tracks (T1, T2). A horizontal distance between the conductive features 130, 170, i.e., a horizontal distance (D2) between the conductive feature 170 and the track (T1) may not comply with the layout design rule and is less than the horizontal distance (D1).

Figure 4:
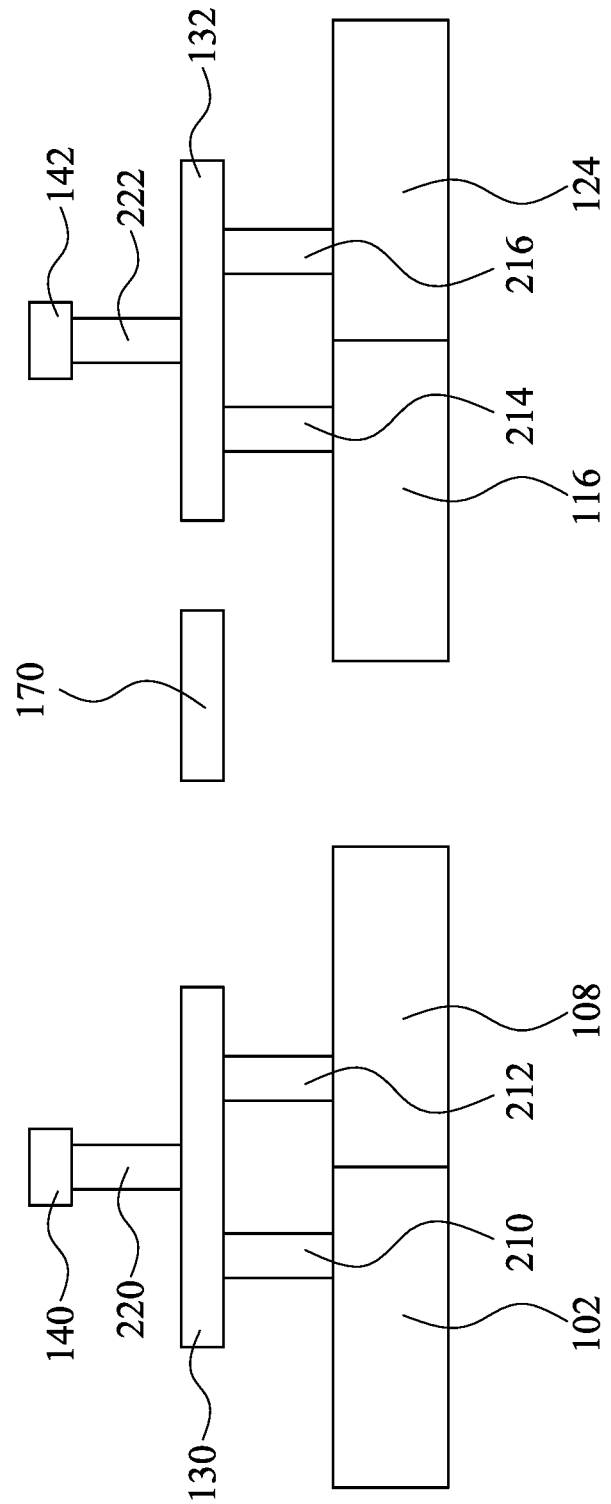
FIG. 4 is a schematic cross-sectional view of an integrated circuit in accordance with some embodiments of the present disclosure.

It is noted that that the horizontal distance (D2), in an alternative embodiment, can be reduced to 0, i.e., the conductive feature 170 is at the track (T1). In such an alternative embodiment, as illustrated in FIG. 4, which is a schematic cross-sectional view of the integrated circuit 100 in accordance with some embodiments of the present disclosure, the conductive feature 170 is directly between the conductive features 130, 132.

Figure 5:
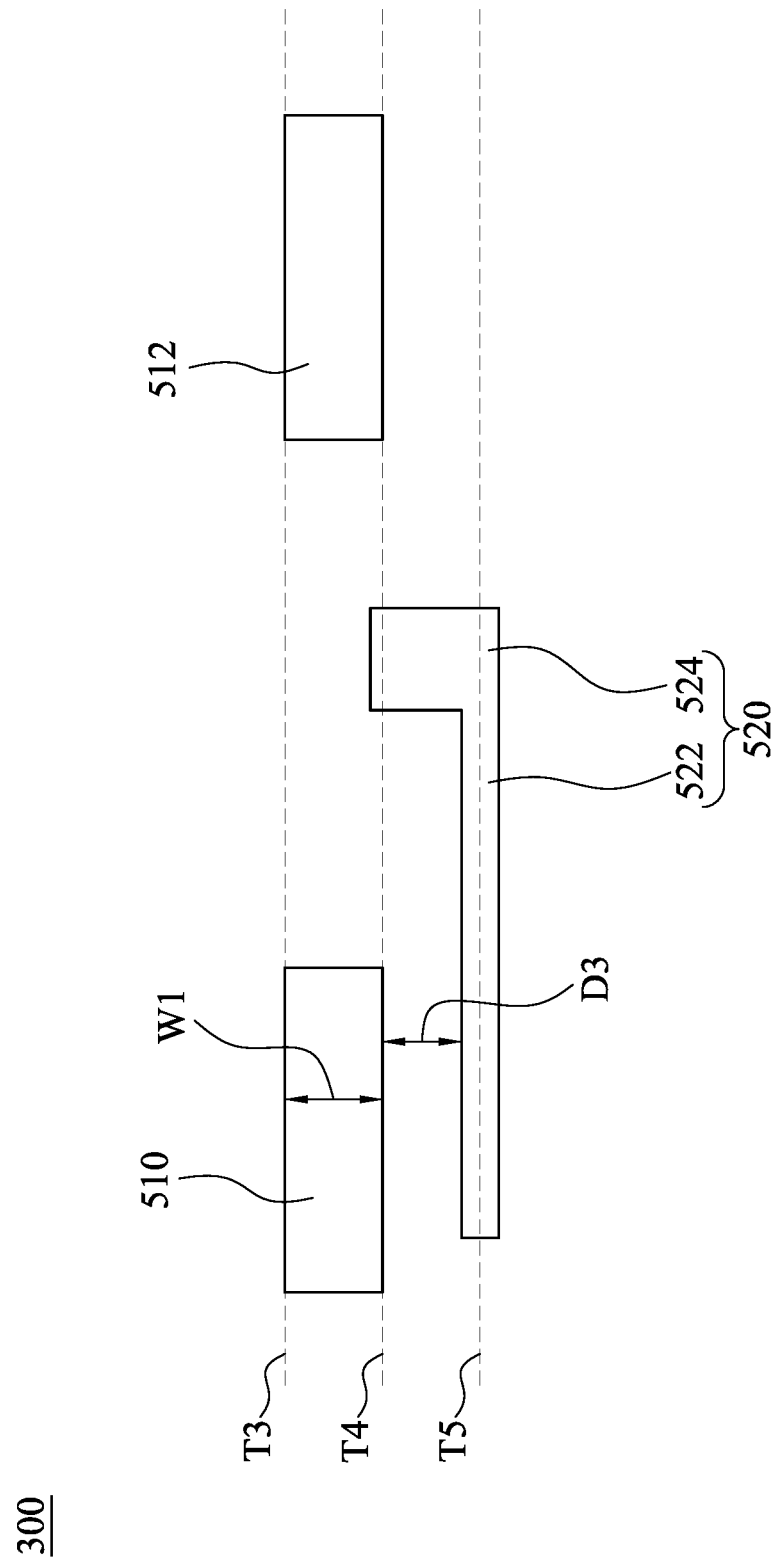
FIG. 5 is a schematic top view of an integrated circuit in accordance with some other embodiments of the present disclosure.

Reference is made to FIG. 5, which is a schematic top view of a metal layer, e.g., M8 layer, of an integrated circuit, e.g., integrated circuit 100, in accordance with some embodiments of the present disclosure. In this exemplary embodiment, the integrated circuit 100 further includes a plurality of tracks (T3, T4, T5) and a plurality of conductive features 510, 512, 520 that are in the same metal layer, e.g., M8 layer, above the conductive features 160, 162 of FIG. 1.

The integrated circuit 100 is further configured to receive the supply voltage through the conductive features 510, 512 and to send a circuit signal through the conductive feature 520. As illustrated in FIG. 5, the conductive features 510 and 512 are rectangular-shaped conductive features. Other suitable conductive features are contemplated herein, e.g., L-shaped conductive features, U-shape conductive features, and the like. In some embodiments, a length of the conductive feature 510/512 in a range from about one to ten times a width of the conductive feature 510/512.

The conductive features 510, 512 are between the adjacent tracks (T3, T4) and define a gap therebetween. In this exemplary embodiment, the conductive feature 510 has a width (W1) substantially equal to a pitch of the tracks (T3, T4, T5). In an alternative embodiment, the conductive feature 510 has a width less than the pitch of the tracks (T3, T4, T5). In various embodiments, the conductive feature 512 may have the same width as or a larger/smaller width than the conductive feature 510.

The conductive feature 520 is hammer-shaped or L-shaped conductive feature 520 and has a first portion 522 and a second portion 524 that extends from the first portion 520. In this exemplary embodiment, the first portion 522 of the conductive feature 520 extends along the track (T5) and has a smaller width than the conductive feature 510. Further, the second portion 524 of the conductive feature 520 has a length less than a length of the first portion 522 of the conductive feature 520 and extends from the first portion 522 of the conductive feature 520. In an alternative embodiment, the second portion 524 of the conductive feature 520 has a length greater than or equal to a length of the first portion 522 of the conductive feature 520.

It is noted that, with reference to FIG. 5, because the conductive features 510, 512 are between the adjacent tracks (T3, T4), the conductive feature 520 can be arranged such that the first portion 522 thereof is at the track (T5) and such that the second portion 524 thereof extends into the gap between the conductive features 510, 512. This enhances a routing density of the integrated circuit 100.

In some embodiments, a distance (D3) between an edge of the conductive feature 510 and an edge of the first portion 522 of the conductive feature 520 is less than the width (W1) of the conductive feature 510. In other embodiments, a distance (D3) between an edge of the conductive feature 510 and an edge of the first portion 522 of the conductive feature 520 is less than the pitch of the tracks (T3, T4, T5).

The integrated circuit 100 further includes a plurality of conductive vias (not shown), each of which has a larger size, e.g., width, than the conductive vias 210, 212, 214, 216, 220, 222, 240, 242. Each of these larger size vias interconnects a respective one of the conductive features 510, 512, 520 and a metal line of a metal layer, e.g., M7 layer, underlying the conductive features 510, 512, 520.

Figure 6:
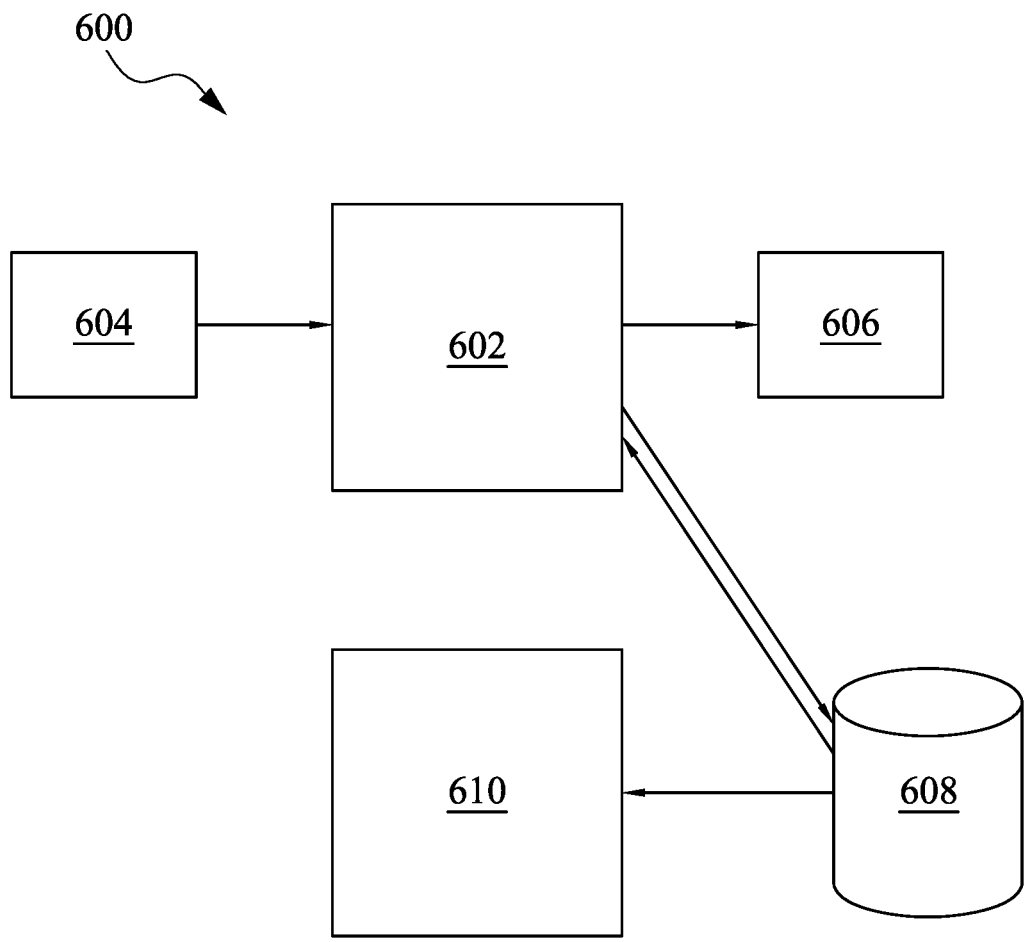
FIG. 6 is a block diagram illustrating a processing system configured to generate an integrated circuit layout in accordance with some embodiments of the present disclosure.

Referring to FIG. 6, which is a processing system configured to generate the above-described layouts in accordance with some embodiments of the present disclosure. The processing system 600 includes a processor 602, which may include a central processing unit, an input/output circuitry, a signal processing circuitry, and a volatile and/or a non-volatile memory. The processor 602 receives input, such as user input, from an input device 604. The input device 604 may include at least one of a keyboard, a mouse, a tablet, a contact sensitive surface, a stylus, a microphone, and the like. The processor 602 may also receive input, such as standard cells, cell libraries, models, and the like, from a machine readable permanent storage medium 608. The machine readable permanent storage medium 608 may be located locally to the processor 602, or may be remote from the processor 602, in which communications between the processor 602 and the machine readable permanent storage medium 608 occur over a network, such as a telephone network, the Internet, a local area network, wide area network, or the like. The machine readable permanent storage medium 608 may include at least one of a hard disk, a magnetic storage, an optical storage, a non-volatile memory storage, and the like. Included in the machine readable permanent storage medium 608 may be database software for organizing data and instructions stored on the machine readable permanent storage medium 608. The processing system 600 may include an output device 606, such as a display device, a speaker, and the like for outputting information to a user. As described above, the processor 602 is configured to generate a layout for an integrated circuit. The layout may be stored in the machine readable permanent storage medium 608. One or more integrated circuit manufacturing machines, such as a photomask generator 610 may communicate with the machine readable permanent storage medium 608, either locally or over a network, either directly or via an intermediate processor such as processor 602. In some embodiments, the photomask generator 610 generates one or more photomasks to be used in the manufacture/fabrication of an integrated circuit, in conformance with a layout stored in the machine readable permanent storage medium 608. Thereafter, the integrated circuit 100 may be fabricated based on the integrated circuit 100 layout generated by the processing system.

Figure 7:
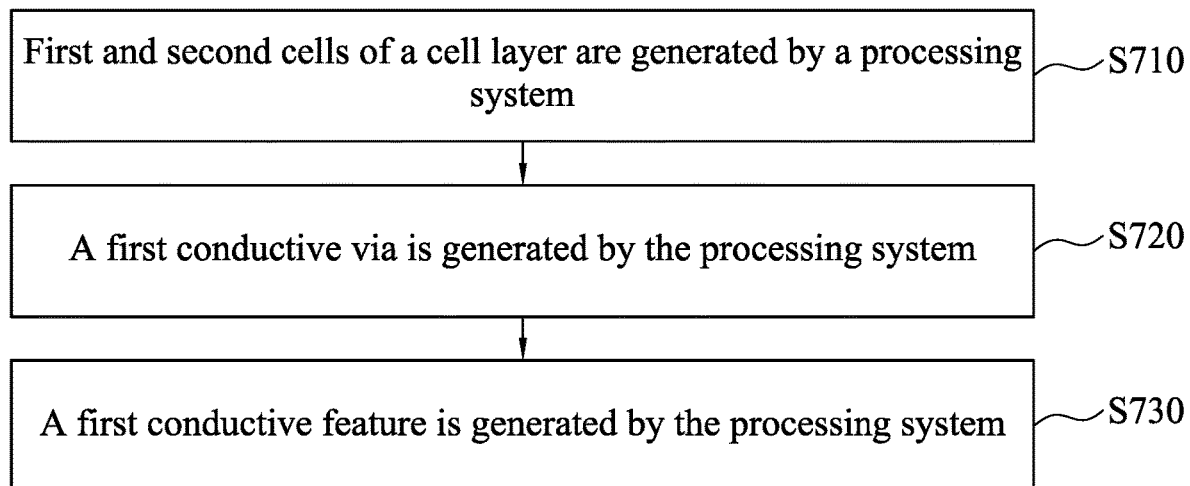
FIG. 7 is an exemplary method of generating an integrated circuit layout in accordance with some embodiments of the present disclosure.

Referring to FIG. 7, which is an exemplary method 700 of generating an integrated circuit layout in accordance with some embodiments of the present disclosure. The method 700 begins with block 710 in which first and second cells of a cell layer, e.g., cells 102, 108 of FIG. 1, are generated by a processing system, e.g., processing system 600 of FIG. 6. The method 700 continues with block 720 in which a first conductive via, e.g., conductive via 210/212 of FIG. 2, is generated by the processing system 600. A first end of the first conductive via 210/212 is in contact with the cell 102/108. The method continues with block 730 in which a first conductive feature, e.g., conductive feature 130 of FIG. 1, is generated by the processing system 600. The first conductive feature 130 is configured to receive a supply voltage, is in contact with a second end of the first conductive via 210/212, and extends from the first cell 102 into the second cell 108.

The method 700 further comprises generating first and second tracks, e.g., tracks (T1, T2) of FIG. 1, by the processing system 600, and the first conductive feature 130 is generated to extend along the first track (T1). The method 700 further comprise generating a second conductive feature, e.g., conductive feature 170 of FIG. 1, by the processing system 600, in which the first and second conductive features 130, 170 are in the same metal layer. The second conductive feature 170 is configured to receive a circuit signal. The second conductive feature 170 is generated such that a distance, e.g., distance (D2) of FIG. 1, between the first track T1 and the second conductive feature 170 is less than a pitch of the first and second tracks T1, T2, e.g., distance (D1) of FIG. 1.

The method 700 further comprises generating third and fourth cells, e.g., cells 116, 124 of FIG. 1, by the processing system 600, and each of the third and fourth cells 116, 124 is configured to perform a circuit function. Next, a third conductive feature, e.g., conductive feature 132 of FIG. 1, is generated by the processing system 600, in which the third conductive feature 132 is generated to extend from the third cell 116 into the fourth cell 124. The third conductive feature 132 is configured to receive the supply voltage and extends along the same track as the first conductive feature 130, e.g., track T1 of FIG. 1.

The method 700 further comprises generating a second conductive via, e.g., conductive via 220 of FIG. 2, by the processing system 600. The second conductive via 220 is generated such that a first end of the second conductive via 220/is in contact with the first conductive feature 130. Next, a fourth conductive feature, e.g., conductive feature 140 of FIG. 1, across the first conductive feature 130 is generated by the processing system 600. The fourth conductive feature 140 is generated such that the fourth conductive feature 140 is in contact with a second end of the second conductive via 220. In some embodiment, the fourth conductive feature 140 is above the first conductive feature 130 and across the first and second cells 102, 108, and the fourth conductive feature 140 above and across the first conductive feature 130 is electrically coupled to the first conductive feature 130 through the second conductive via 220.

The method 700 further comprises generating a fifth conductive feature, e.g., conductive feature 160/162 of FIG. 1, above the first conductive feature 130 and outside the first and second cells 102 and 108 by the processing system 600. The fifth conductive feature 160/162 is electrically coupled to the first conductive feature 130, such as electrically coupling to the first conductive feature 130 by one or more than one conductive via.

The method 700 further comprises sixth and seventh conductive features, e.g., conductive features 510 and 512 of FIG. 5, above the first conductive feature 130 and between third and fourth tracks, e.g., tracks (T3, T4) of FIG. 5, by the processing system 600. The sixth and seventh conductive features, 510, 512 are configured to receive the supply voltage. Next, an L-shaped eighth conductive feature, e.g., conductive feature 520 of FIG. 5, is generated by the processing system 600. The L-shaped eighth conductive feature 520 is configured to receive a circuit signal and extends along a third track, e.g., track (T5) of FIG. 5, and into a gap between the sixth and seventh conductive features, 510, 512. The sixth, seventh, and eighth conductive features 510, 512, 520 are in the same metal layer.

The integrated circuit 100 may be fabricated by performing the method 700, such that the integrated circuit 100 layout is generated. Before performing the method 700, a substrate may be provided, and then a plurality of cells, e.g., cells 102, 108, 116, 124 of FIG. 1, are formed on the substrate. In some embodiments, the substrate includes a semiconductor substrate. In some embodiments, the substrate includes a bulk silicon substrate. In some embodiments, the substrate may be silicon in a crystalline structure. In some embodiments, the substrate may include other elementary semiconductors, such as germanium, or include a compound semiconductor, such as silicon carbide, gallium arsenide, indium arsenide, or indium phosphide. In some embodiments, the substrate includes a silicon-on-insulator (SOI) substrate. The SOI substrate may be fabricated using separation by implantation of oxygen, wafer bonding, and/or other suitable methods. In some embodiments, the substrate is patterned to form a fin structure extending in an elongate manner. In some embodiments, a plurality of gate structures are formed on the fin structure and a plurality of epitaxial source/drain (S/D) features are formed from the fin structure, such that at least one N-type metal-oxide-semiconductor field effect transistor (referred to as an NMOSFET) or at least one P-type metal-oxide-semiconductor field effect transistor (referred to as a PMOSFET) is formed. In some embodiments, at least one dielectric layer is formed above the gate structures and the epitaxial S/D features, so as to form the cells on the substrate. As described previously, the conductive features are in the corresponding metal layer which are above the cells. These metal layer are formed above the cells and made of a conductive material, such as copper, tungsten, aluminum, or combinations thereof.

As described above, the integrated circuit includes a conductive feature, a first cell, and a second cell. The conductive feature is configured to receive a supply voltage. A bottom edge of a boundary of the first cell coincides with a top edge of a boundary of the second cell. The conductive feature extends along a track. The conductive feature can be designed as being in a stub shape and extend from within the first cell into the second cell. As such, another conductive feature can be arranged very near or close the track, thereby enhancing a routing density of the integrated circuit. Furthermore, the integrated circuit includes a pair of conductive features that are configured to receive a supply voltage and that define a gap therebetween. The pair of the conductive features are arranged to be off-track. As such, a portion of an L-shaped or hammer-shaped conductive feature can extend into the gap, thereby enhancing a routing density of the integrated circuit.

In some embodiments of the present disclosure, an integrated circuit includes a cell layer including a first cell and a second cell, a first metal layer over the cell layer and having a first conductive feature, a second metal layer over the first metal layer and having a second conductive feature, and a first via between the first metal layer and the second metal layer and connecting the first conductive feature to the second conductive feature. The first conductive feature spans over a boundary between the first and second cells, and has a lengthwise direction along a first direction. The second conductive feature spans over the boundary between the first and second cells, and has a lengthwise direction along a second direction that is perpendicular to the first direction.

In some embodiments of the present disclosure, an integrated circuit includes a cell layer including a first cell and a second cell, a first metal layer over the cell layer, a first via, and a second via. The first metal layer includes a first conductive feature vertically over the first cell and having a linear top profile, a second conductive feature vertically over the second cell and having a linear top profile, and a third conductive feature having a portion non-overlapping the first and second cells, and having an L-shape top profile. The first via connects the first conductive feature and the first cell. The second via connects the second conductive feature and the second cell.

In some embodiments of the present disclosure, an integrated circuit includes a cell layer including a first cell and a second cell separated by a non-zero distance, a first metal layer over the cell layer, and a second metal layer over the first metal layer. The first metal layer includes a first conductive feature overlapping the first cell and having a lengthwise direction along a first direction, and a second conductive feature overlapping the second cell and having a lengthwise direction along the first direction. The second metal layer includes a third conductive feature overlapping both the first and second cells and having a lengthwise direction along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a cell layer including a first cell and a second cell;
a first metal layer over the cell layer and having a first conductive feature, wherein the first conductive feature spans over a boundary between the first and second cells, and has a lengthwise direction along a first direction, and wherein the first metal layer further comprises a third conductive feature, the third conductive feature being misaligned with the first conductive feature along the first direction;
a second metal layer over the first metal layer and having a second conductive feature, wherein the second conductive feature spans over the boundary between the first and second cells, and has a lengthwise direction along a second direction that is perpendicular to the first direction, and wherein a shortest distance between a center line of the first conductive feature and a center line of the third conductive feature along the second direction is less than a width of the first conductive feature; and
a first via between the first metal layer and the second metal layer and connecting the first conductive feature to the second conductive feature.

2. The integrated circuit of claim 1, further comprises a third metal layer over the second metal layer and having a fourth conductive feature, wherein the fourth conductive feature spans over the boundary between the first and second cells,
and has a lengthwise direction along the first direction, and wherein the fourth conductive feature is longer than the first conductive feature along the first direction.

3. The integrated circuit of claim 2, wherein the fourth conductive feature extends to a region outside the first and second cells.

4. The integrated circuit of claim 1, wherein the cell layer further comprises a third cell separated from the first and second cells, and the first and second conductive features do not overlap the third cell.

5. The integrated circuit of claim 4, wherein the first metal layer further comprises a fourth conductive feature overlapping the third cell, wherein the third conductive feature is aligned with the first conductive feature along the first direction.

6. The integrated circuit of claim 1, wherein the third conductive feature has an L-shape top profile.

7. The integrated circuit of claim 1, wherein the cell layer further comprises a third cell separated from the first and second cells, and a portion of the third conductive feature overlaps the third cell.

8. An integrated circuit, comprising:
a cell layer including a first cell and a second cell;
a first metal layer over the cell layer, comprising:
a first conductive feature vertically over the first cell and having a linear top profile;
a second conductive feature vertically over the second cell and having a linear top profile; and
a third conductive feature having a portion non-overlapping the first and second cells, and having an L-shape top profile;
a first via connecting the first conductive feature and the first cell; and
a second via connecting the second conductive feature and the second cell.

9. The integrated circuit of claim 8, wherein the first conductive feature is aligned with the second conductive feature along a first direction.

10. The integrated circuit of claim 8, wherein the third conductive feature has a portion extending to an end-to-end region between the first conductive feature and the second conductive feature.

11. The integrated circuit of claim 8, wherein the third conductive feature overlaps the second cell and does not overlaps the first cell.

12. The integrated circuit of claim 8, wherein a shortest distance between a center line of the first conductive feature and a center line of the third conductive feature is less than a width of the first conductive feature.

13. The integrated circuit of claim 8, wherein the first conductive feature overlaps a boundary of the first cell.

14. The integrated circuit of claim 8, wherein the first and second conductive features have substantially a same width.

15. An integrated circuit, comprising:
- a cell layer including a first cell and a second cell separated by a non-zero distance;
- a first metal layer over the cell layer, comprising:
  - a first conductive feature overlapping the first cell and having a lengthwise direction along a first direction; and
  - a second conductive feature overlapping the second cell and having a lengthwise direction along the first direction;
- a second metal layer over the first metal layer, comprising a third conductive feature overlapping both the first and second cells and having a lengthwise direction along the first direction; and
- a third metal layer between the first and second metal layers, wherein the third metal layer comprises a fourth conductive feature electrically connecting the first and third conductive features, and a fifth conductive feature electrically connecting the second and third conductive features.

16. The integrated circuit of claim 15, wherein the first metal layer further comprises a sixth conductive feature, and wherein a shortest distance between the first conductive feature and the sixth conductive feature is less than a width of the first conductive feature.

17. The integrated circuit of claim 16, wherein the sixth conductive feature has a portion between the first and second conductive features along the first direction.

18. The integrated circuit of claim 15, wherein the fourth conductive feature overlaps the first and third conductive features and the fifth conductive feature overlaps the second and third conductive features.

19. The integrated circuit of claim 15, wherein the cell layer further comprises a third cell adjacent to the first cell, and the first conductive feature overlaps a boundary of the first cell and the third cell.

20. The integrated circuit of claim 15, wherein the fourth conductive feature and the fifth conductive feature have a lengthwise direction along a second direction perpendicular to the first direction.

* * * * *